(12) United States Patent
Maejima et al.

(10) Patent No.: US 6,791,392 B2
(45) Date of Patent: Sep. 14, 2004

(54) CIRCUIT FOR SHIFTING AN INPUT SIGNAL LEVEL INCLUDING COMPENSATION FOR SUPPLY VOLTAGE VARIATION

(75) Inventors: Toshio Maejima, Iwata (JP); Akihiko Toda, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/253,787

(22) Filed: Sep. 24, 2002

(65) Prior Publication Data

US 2003/0080796 A1 May 1, 2003

(30) Foreign Application Priority Data

Sep. 27, 2001 (JP) ........................................ 2001-298266
Apr. 30, 2002 (JP) ........................................ 2002-128890

(51) Int. Cl.[7] ................................................ H03L 5/00
(52) U.S. Cl. ........................ 327/333; 327/108; 326/80; 326/81
(58) Field of Search ......................... 327/108–112, 333, 327/434, 436, 437; 326/80, 81, 83

(56) References Cited

U.S. PATENT DOCUMENTS

| | | | |
|---|---|---|---|
| 5,834,948 A | * 11/1998 | Yoshizaki et al. | ............ 326/81 |
| 5,844,767 A | 12/1998 | Komiya et al. | ......... 365/189.01 |
| 6,064,229 A | * 5/2000 | Morris | ........................ 326/81 |
| 6,127,848 A | * 10/2000 | Wert et al. | ..................... 326/81 |
| 6,222,384 B1 | * 4/2001 | Kim | ............................. 326/68 |
| 6,407,579 B1 | * 6/2002 | Goswick | ...................... 326/81 |
| 6,433,583 B1 | * 8/2002 | Micheloni et al. | ............ 326/80 |
| 6,445,622 B1 | * 9/2002 | Hirano | .................. 365/189.11 |

FOREIGN PATENT DOCUMENTS

| JP | 04253417 | 9/1992 |
|---|---|---|
| WO | WO 02/054707 A3 | 7/2002 |

* cited by examiner

Primary Examiner—Kenneth B. Wells
(74) Attorney, Agent, or Firm—Pillsbury Winthrop LLP

(57) ABSTRACT

A signal level shift circuit is provided for different circuit systems operating based on different supply voltages (VDDL, VDDH), wherein a supply voltage detection circuit detects a reduction of a first supply voltage (VDDL) regarding an input signal (IN). A level shift circuit comprises a load circuit portion consisting of PMOS transistors and a drive circuit portion consisting of NMOS transistors, all of which are connected together to form current paths. A switch circuit arranged for the current paths opens when a reduction is detected in the first supply voltage so that both the NMOS transistors are turned on. Thus, it is possible to effectively avoid occurrence of through currents flowing in the level shift circuit. The level shift circuit is followed by a flip-flop, which provides an output signal (OUT) in conformity with a second supply voltage (VDDH).

9 Claims, 4 Drawing Sheets

CIRCUIT FOR SHIFTING AN INPUT SIGNAL LEVEL INCLUDING COMPENSATION FOR SUPPLY VOLTAGE VARIATION

BACKGROUND OF THE INVENTION

1. Field of the Invention

This invention relates to signal level shift circuits that shift signal levels between different electric circuit systems operating based on different supply voltages, so that signals of one circuit system are converted to be suitable for another circuit system.

2. Description of the Related Art

FIG. 4A shows a typical example of the configuration of a signal level shift circuit, which receives an input signal 'IN' whose level is 3V to provide an output signal 'OUT' whose level is 5V. That is, the overall configuration of FIG. 4A contains a VDDL circuit system operating based on a relatively low supply voltage VDDL of 3V, and a VDDH circuit system operating based on a relatively high supply voltage VDDH of 5V. The VDDL circuit system comprises inverters IV1 and IV2 for producing complementary signals with respect to the input signal IN. The VDDH circuit system comprises a level shift circuit LS, which forms a main part of the signal level shift circuit, and an inverter IV3 for waveform shaping.

Specifically, the VDDL circuit system has a CMOS (i.e., Complementary Metal-Oxide Semiconductor) configuration consisting of the inverters IV1 and IV2, which operate based on the supply voltage VDDL of 3V. Herein, the inverter IV1 is supplied with the input signal IN from an external device (not shown), and the output terminal thereof is connected to the input terminal of the inverter IV2. That is, the inverter IV1 outputs an inverse phase signal (or inversion signal) of the input signal IN, while the inverter IV2 outputs a same phase signal of the input signal IN.

The level shift circuit LS comprises a load circuit portion consisting of p-channel metal-oxide field-effect transistors (hereinafter, referred to as PMOS transistors) TP1 and TP2, and a drive circuit portion consisting of n-channel metal-oxide semiconductor field-effect transistors (hereinafter, referred to as NMOS transistors) TN1 and TN2, wherein the load circuit portion is driven by the drive circuit portion. The sources of the PMOS transistors TP1 and TP2 are commonly connected with the voltage supply VDDH of 5V. In addition, the gates and drains of the PMOS transistors TP1 and TP2 are alternately connected to each other. That is, the gate of the PMOS transistor TP1 is connected with the drain of the PMOS transistor TP2, and the gate of the PMOS transistor TP2 is connected with the drain of the PMOS transistor TP1.

The drain of the NMOS transistor TN1 is connected to the drain of the PMOS transistor TP1 via a node Na, and the drain of the NMOS transistor TN2 is connected to the drain of the PMOS transistor TP2 via a node Nb. In addition, the sources of the NMOS transistors TN1 and TN2 are both grounded. The gate of the NMOS transistor TN1 is supplied with the inverse phase signal of the input signal IN from the inverter IV1. The gate of the NMOS transistor TN2 is supplied with the same phase signal of the input signal IN from the inverter IV2. That is, the gates of the NMOS transistors TN1 and TN2 are respectively supplied with complementary signals, which are complementary to each other.

The node Nb that is established between the drains of the PMOS transistor TP2 and the NMOS transistor TN2 is connected to the input terminal of the inverter IV3 having a CMOS configuration, which operates based on the prescribed voltage of 5V. Therefore, the inverter IV3 provides the output signal OUT, which is an inverse signal of a signal appearing at the node Nb.

The inverters IV1 and IV2 of the VDDL circuit system, and the level shift circuit LS and inverter IV3 of the VDDH circuit system are all given the same ground potential of 0V, which is the reference potential in measurement of signal levels in the VDDL circuit system and VDDH circuit system. That is, the VDDL circuit system receiving the input signal IN has the prescribed signal level of 3V based on the reference ground potential, and the VDDH circuit system providing the output signal OUT has the prescribed signal level of 5V based on the reference ground potential.

Next, the overall operation of the signal level shift circuit of FIG. 4A will be described with reference to FIG. 4B.

When the input signal IN is low (i.e., 0V) in the VDDL circuit system, the inverter IV1 outputs a signal whose level is 3V, and the inverter IV2 outputs a signal whose level is 0V. In the VDDH circuit system, the NMOS transistor TN1 whose gate receives the output signal of the inverter IV1 is turned on, while the NMOS transistor TN2 whose gate receives the output signal of the inverter IV2 is turned off.

Due to the ON state of the NMOS transistor TN1, the node Na is pulled down to a low level, so that the PMOS transistor TP2 whose gate is connected with the node Na is turned on. At this time, the NMOS transistor TN2 is turned off while the node Nb is pulled up to a high level (5V), so that the PMOS transistor TP1 whose gate is connected with the node Nb is turned off. The inverter IV3 receives the high level (5V) of the node Nb to provide the output signal OUT having a low level.

In contrast, when the input signal IN is high (i.e., 3V) in the VDDL circuit system, the inverter IV1 outputs a signal whose level is 0V while the inverter IV2 outputs a signal whose level is 3V. In this case, the NMOS transistor TN1 is turned off while the NMOS transistor TN2 is turned on. As a result, the node Nb is pulled down to the low level (0V), so that the IV3 operating based on the low-level potential of the node Nb outputs a high-level signal OUT of 5V.

As described above, the signal level circuit of FIG. 4A works in such a way that the input signal whose level is 3V is converted to the output signal OUT whose level is 5V. Thus, it is possible to realize communication of signals between different circuit systems that operate based on different supply voltages respectively.

With respect to the PMOS transistor TP1 and the NMOS transistor TN1 that are connected in series between the power supply VDDH and the ground, the PMOS transistor TP1 is turned off during the period in which the input signal IN is low (0V), while the NMOS transistor TN1 is turned off during the period in which the input signal IN is high (3V). Therefore, there may be no possibility that a through current flows between the power supply VDDH and the ground via these transistors. Similarly, with respect to the PMOS transistor TP2 and the NMOS transistor TN2 that are connected in series between the power supply VDDH and the ground, one of these transistors is selectively turned off, which may indicate no possibility that a through current flows between the power supply VDDH and the ground via these transistors. That is, as long as the input signal IN is securely set to the high or low level, it is possible to reliably secure conversion of signal levels between different circuit systems without causing through currents to flow in the level shift circuit LS.

However, there still remains a problem in that through currents occur and flow in the level shift circuit LS supplied with the supply voltage VDDH when reduction occurs in the supply voltage VDDL.

Next, a description will be given with respect to the mechanism of occurrence of through currents in the level shift circuit LS. In the level shift circuit LS, as long as one of the NMOS transistors TN1 and TN2 is securely turned off, the PMOS transistors TP1 and TP2 are each complementarily turned on in association with the NMOS transistors TN1 and TN2, so that no through current occur in the level shift circuit LS.

For some reason, however, when both the NMOS transistors TN1 and TN2 are temporarily turned on, both the nodes Na and Nb are simultaneously reduced in potentials, so that both the PMOS transistors TP1 and TP2 alternately connected with these nodes are simultaneously turned on. As a result, all the PMOS transistors TP1 and TP2, and the NMOS transistors TN1 and TN2 are simultaneously turned on, so that through currents occur and flow between the voltage supply VDDH and the ground.

The situation in which both the NMOS transistors TN1 and TN2 are simultaneously turned on may happen when a reduction occurs in the supply voltage VDDL so that the outputs of the inverters IV1 and IV2 become unstable or uncertain. That is, when reduction occur in the supply voltage VDDL, due to gate threshold voltages of MOS transistors, both the PMOS transistor and NMOS transistor forming each of the inverters IV1 and IV2 may be simultaneously turned off. As a result, the output signals of the inverters IV1 and IV2 become unstable or uncertain; in some cases, both of them become simultaneously high so that the NMOS transistors TN1 and TN2 will be simultaneously turned on. Such a phenomenon may frequently occur when the supply voltage VDDL is reduced close to the gate threshold voltages (e.g., 0.5V) of the MOS transistors forming the inverters IV1 and IV2.

SUMMARY OF THE INVENTION

It is an object of the invention to provide a signal level shift circuit that causes no through current flowing therethrough even when a reduction occurs in the supply voltage supplied to the input-side circuitry.

A signal level shift circuit of this invention realizes signal level conversion between different circuit systems operating based on different supply voltages (VDDL, VDDH), wherein a supply voltage detection circuit detects a reduction of a first supply voltage (VDDL) regarding an input signal (IN). A level shift circuit comprises a load circuit portion and a drive circuit portion, which are connected together to form current paths. A switch circuit arranged for the current paths opens when a reduction is detected in the first supply voltage so that both the NMOS transistors are turned on. Thus, it is possible to effectively avoid occurrence of through currents flowing in the level shift circuit. The level shift circuit is followed by a flip-flop, which provides an output signal (OUT) in conformity with a second supply voltage (VDDH).

Specifically, the input-side circuit system operating based on the first supply voltage (VDDL) contains a first inverter for inputting the input signal (IN) and a second inverter for inputting the output of the first inverter in addition to the supply voltage detection circuit, while the output-side circuit system operating based on the second supply voltage (VDDH) contains the level shift circuit, flip-flop, and switch circuit. Herein, the drive circuit portion drives the load circuit portion in response to the outputs of the inverters, which are complementary to each other in relation to the input signal. The switch circuit breaks the current paths when the supply voltage detection circuit detects a reduction of the first supply voltage.

The supply voltage detection circuit comprises a PMOS transistor that operates based on the first supply voltage and whose gate is grounded, and a resistor by which the drain of the PMOS transistor is grounded.

In addition, the load circuit portion comprises a pair of PMOS transistors that operate based on the second supply voltage and whose gates and drains are alternately coupled together, while the drive circuit portion comprises a pair of NMOS transistors whose drains are respectively connected with the drains of the pair of the PMOS transistors. The switch circuit comprises an NMOS transistor whose drain is connected respectively with the sources of the pair of the NMOS transistors, whose source is grounded, and whose gate is connected with a node between the drain of the PMOS transistor and the resistor in the supply voltage detection circuit.

Alternatively, the switch circuit comprises a pair of NMOS transistors whose drains are respectively connected with the sources of the pair of the NMOS transistors, whose sources are grounded, and whose gates are commonly connected with a node between the drain of the PMOS transistor and the resistor in the supply voltage detection circuit.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

This invention will be described in further detail by way of examples with reference to the accompanying drawings.

Figure 1:
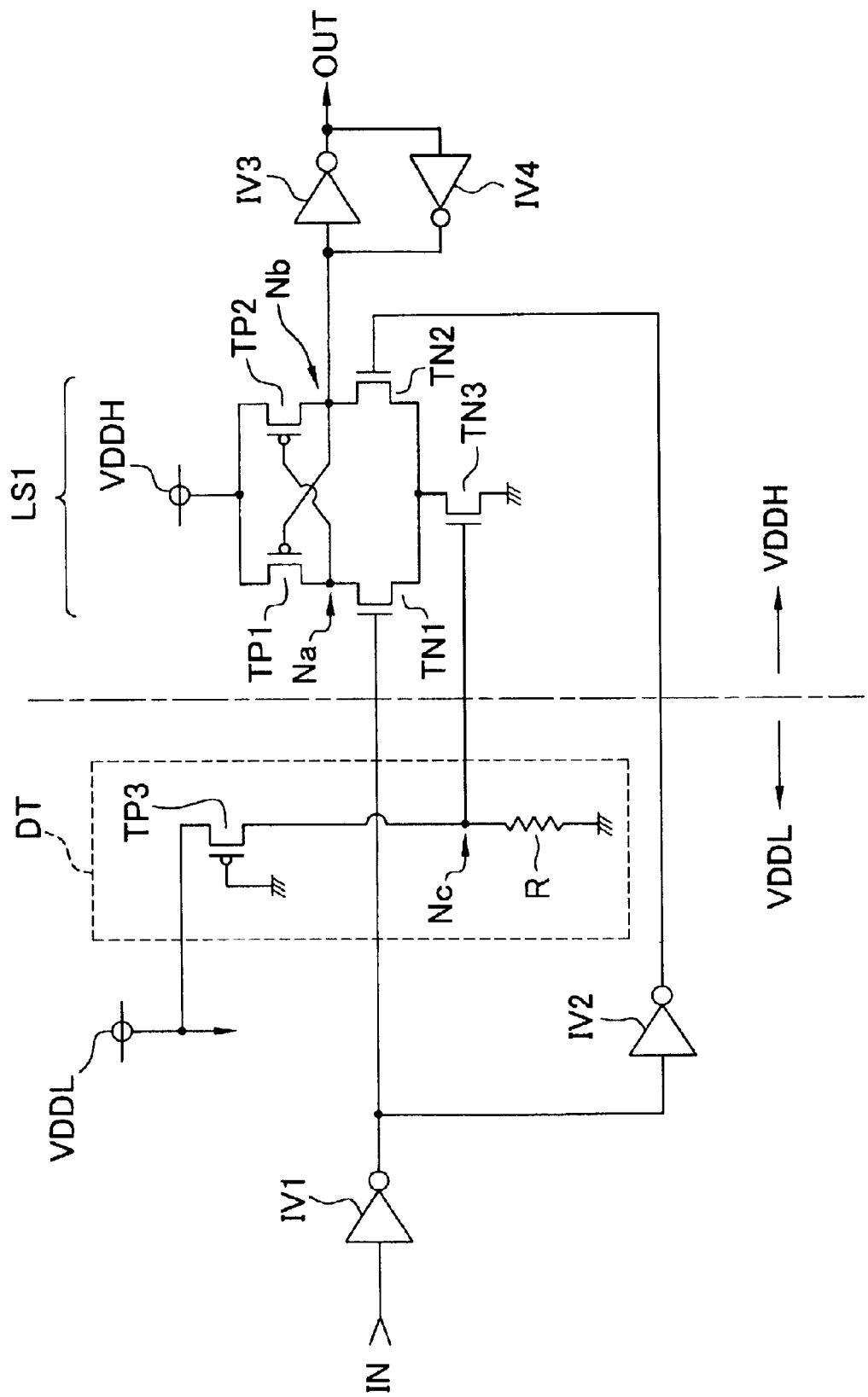
FIG. 1 is a circuit diagram showing the configuration of a signal level shift circuit in accordance with a preferred embodiment of the invention.
Figure 4A:
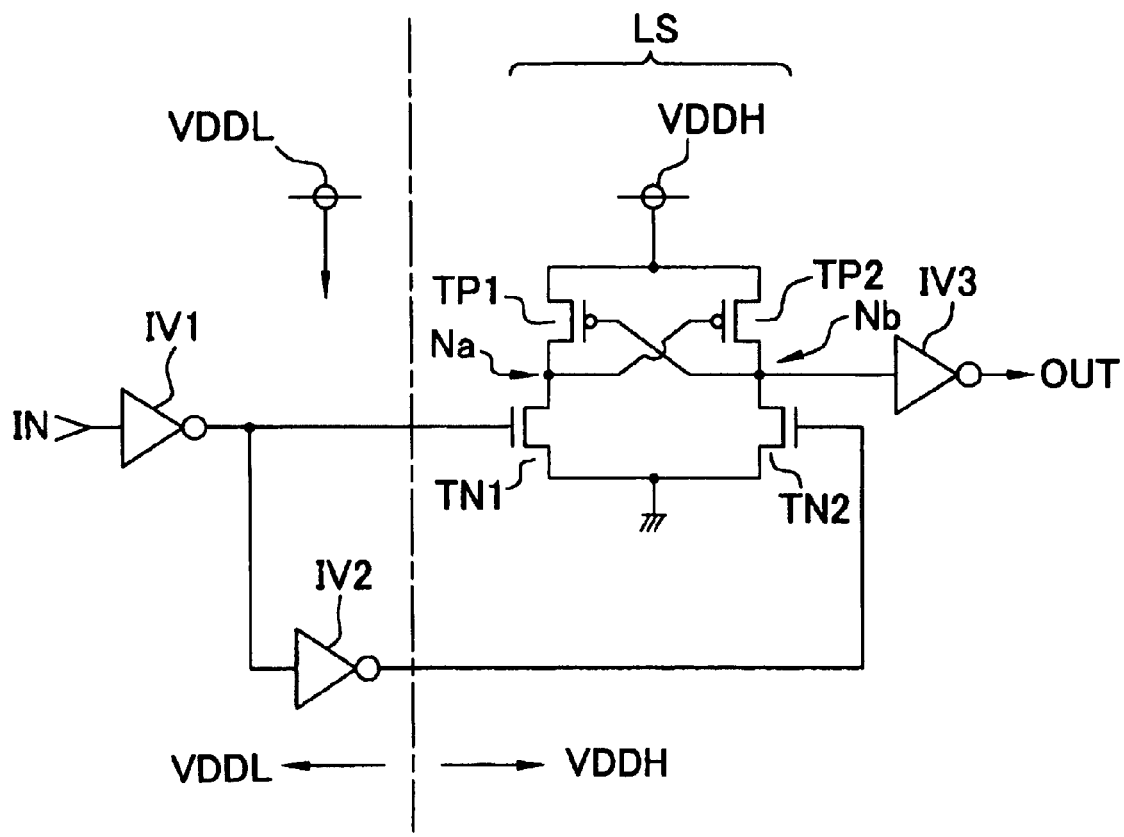
FIG. 4A is a circuit diagram showing a typical example of a signal level shift circuit that performs conversion of signal levels between different circuit systems operating based on different supply voltages.
Figure 4B:
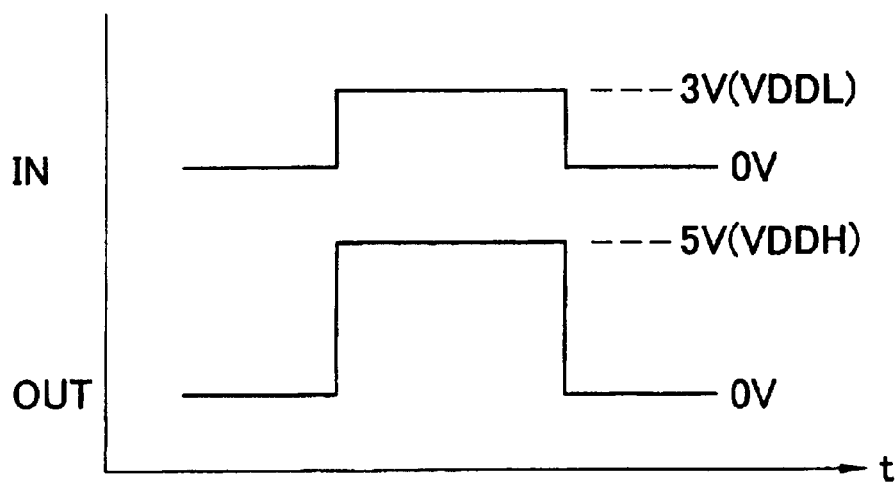
FIG. 4B shows variations of an input signal IN and an output signal OUT of the signal level shift circuit of FIG. 4A.

FIG. 1 shows the circuit configuration of a signal level shift circuit in accordance with the preferred embodiment of the invention, wherein parts identical to those shown in FIG. 4A are designated by the same reference numerals and symbols; hence, the detailed description thereof will be omitted as necessary. Similar to the foregoing signal level shift circuit of FIG. 4A, the signal level shift circuit of FIG. 1 converts input signals whose levels substantially match the prescribed low supply voltage of 3V to output signals whose levels substantially match the prescribed high supply voltage of 5V. Compared with the foregoing signal level shift circuit of FIG. 4A, the VDDL circuit system additionally provides a supply voltage detection circuit DT for detecting reduction of the supply voltage VDDL. In addition, the VDDH circuit system additionally provides a switch circuit (i.e., an NMOS transistor TN3) for opening or breaking the path of a through current upon detection of a reduction of the supply voltage VDDL. Further, the VDDH circuit system provides a flip-flop that comprises a pair of inverters IV3 and IV4, having CMOS configurations, which are alternately coupled together. A level shift circuit LS1 of the VDDH circuit system is followed by this flip-flop.

Specifically, the supply voltage detection circuit DT comprises a PMOS transistor TP3 and a resistor R, which are connected in series between the voltage supply VDDL (3V) and the ground (0V). The source of the PMOS transistor TP3 is connected with the voltage supply VDDL, and the gate thereof is grounded. The drain of the PMOS transistor TP3 is grounded via the resistor R. A node Nc is established as a connection point between the PMOS transistor TP3 and the resistor R. The resistance of the resistor R is increased to be sufficiently higher than the on-resistance of the PMOS transistor TP3. Therefore, it is possible to reduce a current flowing through them to be sufficiently small.

Similar to the foregoing level shift circuit LS shown in FIG. 4A, the level shift circuit LS1 shown in FIG. 1 comprises a load circuit portion containing PMOS transistors TP1 and TP2, and a drive circuit portion containing NMOS transistors TN1 and TN2 as well as the NMOS transistor TN3 for breaking or blocking a through current flowing therethrough. The drains and gates of the PMOS transistors TP1 and TP2 are alternately connected together between nodes Na and Nb at which the supply voltage VDDH of 5V may emerge respectively. The NMOS transistors TN1 and TN2 are also connected between the nodes Na and Nb in connection with the drain of the NMOS transistor TN3, wherein they operate based on the output signals (e.g., 3V) of the inverters IV1 and IV2 received by the gates thereof, thus driving the aforementioned load circuit portion.

As described above, a single NMOS transistor TN3 forms a switch circuit for breaking or blocking a through current flowing in the level shift circuit LS1. This NMOS transistor TN3 is arranged in relation to the current paths of the aforementioned circuits comprising the PMOS transistors TP1 and TP2, and the NMOS transistors TN1 and TN2. That is, the sources of the NMOS transistors TN1 and TN2 are commonly connected to the drain of the NMOS transistor TN3, the source of which is grounded. The gate of the NMOS transistor TN3 is connected to the node Nc of the supply voltage detection circuit DT in the VDDL circuit system. That is, the switch circuit comprising a single NMOS transistor TN3 is opened or closed in response to the voltage at the node Nc. This switch circuit cooperates together with the supply voltage detection circuit DT to act as a breaking circuit for breaking or blocking through currents flowing in the level shift circuit LS1.

The node Nb corresponds to the output of the level shift circuit LS1 that is followed by a pair of the inverters IV3 and IV4 which have the CMOS configuration operating based on the supply voltage VDDH of 5V and which are alternately coupled together. It was described before that these inverters IV3 and IV4 construct a flip-flop, which is connected with the node Nb. Therefore, an output signal derived from the node Nb of the level shift circuit LS1 is inverted by the inverter IV3 and is output (see 'OUT' in FIG. 1). The inverter IV4 comprises a pair of a PMOS transistor and an NMOS transistor (not shown), current driving abilities of which are sufficiently reduced compared with those of the PMOS transistor TP2 and the NMOS transistor TN2 of the level shift circuit LS1. That is, the current driving abilities of the transistors of the inverter IV4 are set up in such a way that the output signal derived from the node Nb of the level shift circuit LS1 will not be obstructed by the operation of the inverter IV4.

Next, the overall operation of the signal level shift circuit of FIG. 1 will be described in detail with respect to the situation where the supply voltage VDDL is reduced due to a certain cause. For the sake of convenience, the input signal IN is set at a low level in the following description.

When the supply voltage VDDL is 3V, the PMOS transistor TP3 is turned on, so that the supply voltage VDDL is applied to the node Nc via the PMOS transistor TP3 in the supply voltage detection circuit DT. Herein, the resistance 'R' is increased to be sufficiently higher than the on-resistance of the PMOS transistor TP3. Therefore, a certain voltage that substantially matches the supply voltage VDDL (3V) emerges at the node Nc, so that the NMOS transistor TN3 whose gate is connected with the node Nc is turned on. That is, when the supply voltage VDDL is 3V, the sources of the NMOS transistors TN1 and TN2 are grounded via the NMOS transistor TN3. This indicates that the signal level shift circuit of FIG. 1 becomes equivalent to the foregoing signal level shift circuit of FIG. 4A. Thus, the signal level shift circuit of FIG. 1 operates similarly to the foregoing signal level shift circuit of FIG. 4A.

Figure 2:
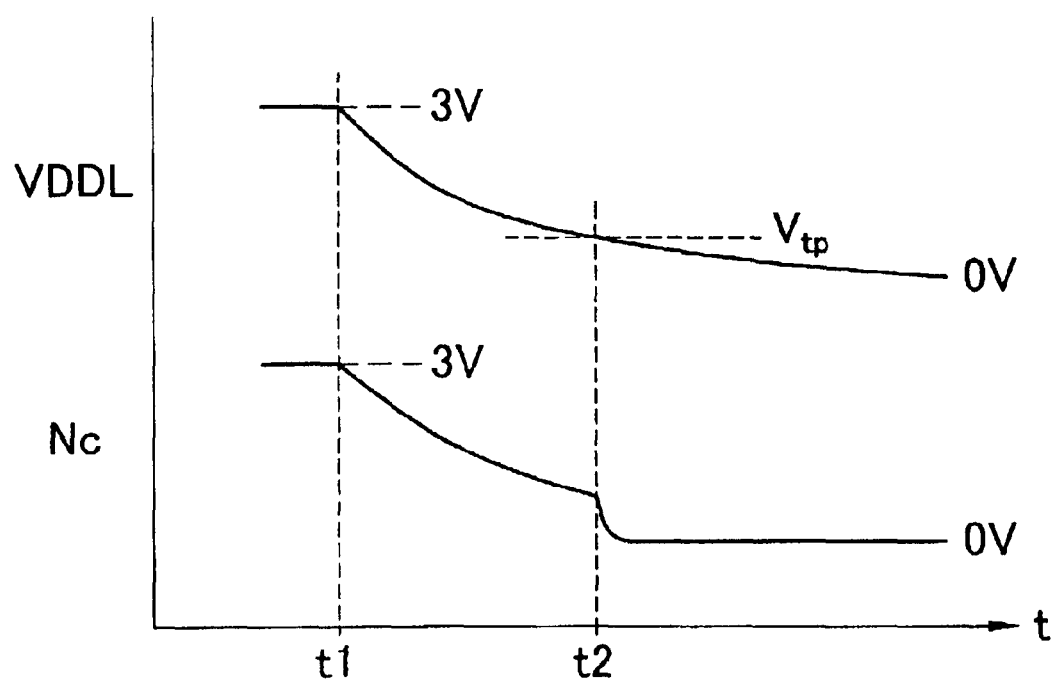
FIG. 2 is a graph showing relationships between potential variations of supply voltage VDDL and node Nc in FIG. 1.

FIG. 2 shows relationships between variations of the supply voltage VDDL and the voltage of the node Nc. At time t1, the supply voltage VDDL starts to decrease from the prescribed voltage of 3V. In this case, the voltage of the node Nc of the supply voltage is correspondingly reduced in response to the reduction of the supply voltage VDDL. As the supply voltage VDDL decreases gradually, the on-resistance of the PMOS transistor TP3 tends to be gradually increased higher, so that the voltage of the node Nc will become lower than the gate threshold value of the NMOS transistor TN3. That is, the NMOS transistor TN3 is turned off when the supply voltage VDDL is reduced sufficiently to be lower than the prescribed voltage of 3V. Then, the supply voltage VDDL is further reduced and reaches the prescribed gate threshold voltage Vtp of the PMOS transistor TP3 at time t2, so that the PMOS transistor TP3 is turned off. Thus, the node Nc is electrically isolated from the voltage supply VDDL after the time t2, so that the node Nc is automatically pulled down to and stabilized at the ground potential (0V) due to the resistor R.

As described above, when a reduction occurs in the supply voltage VDDL, the voltage of the node Nc becomes lower than the gate threshold voltage of the NMOS transistor TN3, which is then turned off. Due to the reduction of the supply voltage VDDL, both the outputs of the inverters IV1 and IV2 become unstable and uncertain; therefore, even when both the NMOS transistors TN1 and TN2 are turned on, currents flowing through these transistors are blocked by the NMOS transistor TN3 that is turned off. In short, it is possible to reliably prevent through currents from flowing in the level shift circuit LS1.

When the NMOS transistor TN3 is turned off, the output of the level shift circuit LS1 becomes unstable. In the foregoing signal level shift circuit of FIG. 4A, when such an 'unstable' output signal of the level shift circuit LS is supplied to the inverter IV3 having a simple CMOS configuration, the input level of the inverter IV3 may become intermediate between the supply voltage VDDH and the ground potential, which may cause a through current in the inverter IV3. In contrast, the present embodiment is designed in such a way that the inverter IV3 receiving the output of the level shift circuit LS1 is coupled together with the inverter IV4 to form a flip-flop. Therefore, even though the output of the level shift circuit LS1 becomes unstable, the node Nb connected with the input of the inverter IV3 is automatically stabilized at one of the supply voltage VDDH and the ground potential. This reliably prevents a through current from occurring in the inverter IV3; in other words, it is possible to effectively break or block through currents flowing in the level shift circuit LS1.

In short, when a reduction occurs in the supply voltage VDDL, it is detected by the supply voltage detection circuit DT, so that the switch circuit comprising a single NMOS transistor TN3 is opened. This reliably breaks the current paths formed by the PMOS transistors TP1 and TP2 and the NMOS transistors TN1 and TN2 between the voltage supply VDDH and the ground. Thus, it is possible to reliably avoid occurrence of through currents.

According to the present embodiment, even though fluctuations occur on the supply voltage VDDL in proximity to 0V due to the reduction of the supply voltage VDDL, the node Nc is electrically isolated or insulated from the voltage supply VDDL unless the supply voltage VDDL exceeds the gate threshold voltage Vtp of the PMOS transistor TP3, so that the gate of the NMOS transistor TN3 for breaking through currents is fixed to 0V in a stable manner due to the resistor R. Therefore, there will be no chance that the NMOS transistor TN3 will expectedly be turned on. Thus, it is possible to effectively avoid occurrence of through currents.

In the above, when the voltage of the node Nb of the level shift circuit LS1 is stabilized at an intermediate level or so, there may still remain a possibility that a through current will occur in the inverter IV3 connected with the node Nb. In order to avoid occurrence of a through current in the inverter IV3, it is possible to additionally provide a PMOS transistor (not shown) whose gate is connected with the node Nc, by which the node Nb corresponding to the input of the inverter IV3 is pulled up to the supply voltage VDDH. Alternatively, it is possible to introduce a simple high resistance element by which the node Nb is pulled up to the supply voltage VDDH.

Next, a modified example of the signal level shift circuit will be described in detail with reference to FIG. 3, wherein parts identical to those shown in FIG. 1 are designated by the same reference numerals and symbols; hence, the detailed description thereof will be omitted as necessary. Compared with the aforementioned signal level shift circuit of FIG. 1, the signal level shift circuit of FIG. 3 is characterized in that the NMOS transistor TN3 for breaking through currents is replaced with a pair of NMOS transistors TN31 and TN32, both of which are used to break through currents.

Figure 3:
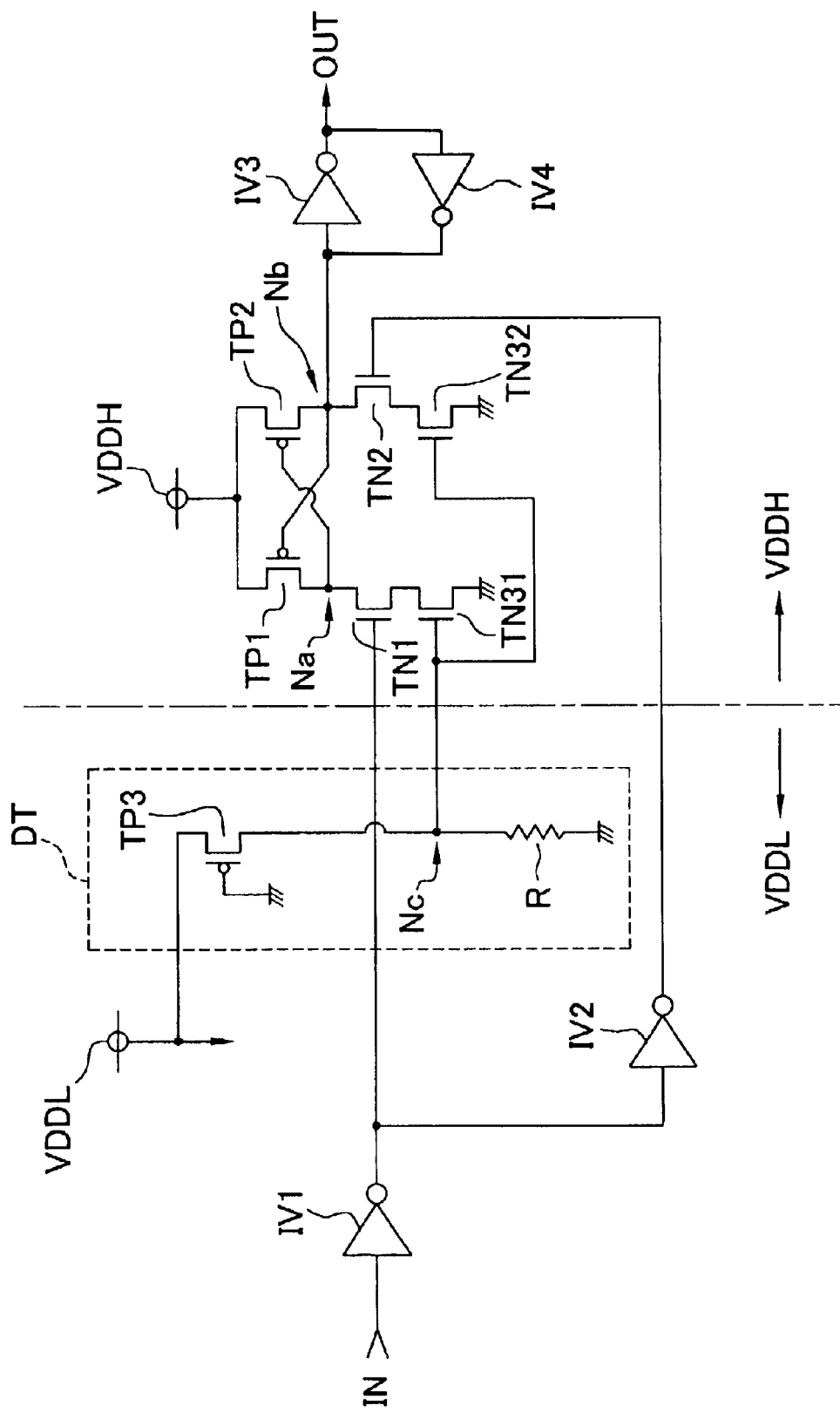
FIG. 3 is a circuit diagram showing the configuration of a modified example of the signal level shift circuit shown in FIG. 1.

In FIG. 3, the drains of the NMOS transistors TN31 and TN32 are respectively connected to the sources of the NMOS transistors TN1 and TN2. The sources of the NMOS transistors TN31 and TN32 are both grounded, and the gates thereof are both commonly connected with the node Nc of the supply voltage detection circuit DT. In the modified example of the signal level shift circuit of FIG. 3, a pair of the NMOS transistors TN1 and TN2 constructing the drive circuit portion are independently connected with the NMOS transistors TN31 and TN32 for breaking through currents flowing therethrough.

Due to the provision of the NMOS transistors TN31 and TN32 independently connected with the NMOS transistors TN1 and TN2, inference may not occur easily between the nodes Na and Nb, and the circuit operation will become further stable in the circuit configuration of FIG. 3 compared with the aforementioned circuit configuration of FIG. 1 that provides a single NMOS transistor TN3 commonly for the NMOS transistors TN1 and TN2.

This invention is described by way of the embodiment and modified example, wherein this invention is not necessarily limited to them; hence, this invention can embrace further modifications or design choices without departing from the scope of the invention. For example, the VDDL circuit system uses two inverters IV1 and IV2 for producing complementary signals of the input signal IN, which are supplied to the level shift circuit LS or LS1. However, if complementary signals of the input signal IN are prepared in advance, it is possible to exclude the inverters IV1 and IV2 from the VDDL circuit system. In addition, it is possible to make a determination as to whether to use the inverter IV3 for waveform shaping in the VDDH circuit system.

The signal level shift circuits of FIGS. 1 and 3 are designed to realize conversion of signal levels from VDDL of 3V to VDDH of 5V. This is merely illustrative. Hence, the signal level shift circuit of this invention can be easily re-designed to realize conversion of signal levels from 5V to 3V. Alternatively, this invention can realize mutual conversion of signal levels arbitrarily determined.

Incidentally, the aforementioned embodiment and example are described in such a way that the input of the inverter IV3 is pulled up in potential as necessary. Of course, it is possible to pull down the input of the inverter IV3 in potential in conformity with the configuration of the level shift circuit LS or LS1.

Lastly, this invention has a variety of technical features and effects, which will be described below.

(1) The signal level shift circuit of this invention breaks current paths of the load circuit portion and drive circuit portion upon detection of a reduction of the first supply voltage (VDDL), which defines the level of an input signal (IN). Therefore, it is possible to avoid occurrence of through currents being caused due to the reduction of the first supply voltage.

(2) Specifically, there are provided a supply voltage detection circuit for detecting a reduction of the first supply voltage (VDDL), and a switch circuit for opening current paths between the second voltage supply (VDDH) and the reference (ground) potential upon detection of the reduction of the first supply voltage. That is, it is possible to reliably break the current paths allowing through currents flowing therethrough by the load circuit portion and drive circuit portion between the second voltage supply and the ground.

(3) The supply voltage detection circuit comprises a PMOS transistor whose source is connected with the first voltage supply (VDDL) and whose gate is supplied with the reference (ground) potential, and a resistor by which the drain of the PMOS transistor is grounded. Thus, it is possible to reliably detect a reduction of the first supply voltage with a simple configuration.

As this invention may be embodied in several forms without departing from the spirit or essential characteristics thereof, the present embodiment and modified example are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A signal level shift circuit that converts an input signal (IN) having a first signal level to an output signal (OUT) having a second signal level, comprising:

a load circuit portion connected between a second voltage supply (VDDH) providing the second signal level and a node for providing the second signal level;

a drive circuit portion connected between a reference potential and the node for providing the second signal level, wherein the drive circuit portion drives the load circuit portion upon receipt of the first signal level; and a breaking circuit portion for breaking current paths formed by the load circuit portion and the drive circuit portion between the second voltage supply and the reference potential in response to variations of a first supply voltage from a first voltage supply (VDDL), which provides the input signal with the first signal level, wherein the breaking circuit portion comprises a supply voltage detection circuit for detecting a reduction of the first supply voltage (VDDL), and a switch circuit that is arranged relative to the current paths formed by the load circuit portion and the drive circuit portion and is opened upon detection of the reduction of the first supply voltage, wherein the supply voltage detection circuit comprises a p-channel metal-oxide semiconductor transistor whose source is connected with the first voltage supply (VDDL) and whose gate is supplied with the reference potential, and a resistor coupled between a drain of the p-channel metal-oxide semiconductor transistor and the reference potential.

2. A signal level shift circuit according to claim 1, wherein the load circuit portion comprises a pair of p-channel metal-oxide semiconductor transistors whose sources are commonly connected with the second voltage source (VDDH) and whose gates and drains are alternately coupled together, while the drive circuit portion comprises a pair of n-channel metal-oxide semiconductor transistors whose drains are respectively connected with the drains of the pair of the p-channel metal-oxide semiconductor transistors and whose gates are supplied with complementary signals each having the first signal level, and wherein the switch circuit comprises an n-channel metal-oxide semiconductor transistor whose drain is connected with the sources of the pair of the n-channel metal-oxide semiconductor transistors, whose source is supplied with the reference potential, and whose gate is connected with a node between the drain of the p-channel metal-oxide semiconductor transistor and the resistor in the supply voltage detection circuit.

3. A signal level shift circuit according to claim 1, wherein the load circuit portion comprises a pair of p-channel metal-oxide semiconductor transistors whose sources are commonly connected with the second voltage source (VDDH) and whose gates and drains are alternately coupled together, while the drive circuit portion comprises a pair of n-channel metal-oxide semiconductor transistors whose drains are respectively connected with the drains of the pair of the p-channel metal-oxide semiconductor transistors and whose gates are supplied with complementary signals each having the first signal level, and wherein the switch circuit comprises a pair of n-channel metal-oxide semiconductor transistors whose drains are respectively connected with the sources of the pair of the n-channel metal-oxide semiconductor transistors, whose sources are commonly supplied with the reference potential, and whose gates are commonly connected with a node between the drain of the p-channel metal-oxide semiconductor transistor and the resistor in the supply voltage detection circuit.

4. A signal level shift circuit according to claim 1, wherein the node for providing the second signal level is connected to a flip-flop consisting of a pair of inverters alternately coupled together.

5. A signal level shift circuit according to claim 1, wherein the reference potential corresponds to a ground potential.

6. A signal level shift circuit allowing conversion from a first signal level and a second signal level between a first circuit system and a second circuit system, comprising:

a first inverter for receiving an input signal (IN) having the first signal level;

a second inverter following the first inverter;

a supply voltage detection circuit for detecting a reduction of a first supply voltage (VDDL) for use in the first circuit system, wherein the supply voltage detection circuit comprises a p-channel metal-oxide semiconductor transistor that operates based on the first supply voltage and whose gate is grounded, and a resistor coupled between a drain of the p-channel metal-oxide semiconductor transistor and a ground potential;

a load circuit portion arranged relative to a second supply voltage (VDDH) for use in the second circuit system;

a drive circuit portion for driving the load circuit portion in response to outputs of the first and second inverters;

a switch circuit for breaking current paths formed by the load circuit portion and the drive circuit portion when the supply voltage detection circuit detects the reduction of the first supply voltage; and a flip-flop for receiving an output of the load circuit portion to provide an output signal (OUT) having the second signal level.

7. A signal level shift circuit according to claim 6, wherein the load circuit portion comprises a pair of p-channel metal-oxide semiconductor transistors that operate based on the second supply voltage and whose gates and drains are alternately coupled together, while the drive circuit portion comprises a pair of n-channel metal-oxide semiconductor transistors whose drains are respectively connected with the drains of the pair of the p-channel metal-oxide semiconductor transistors, and wherein the switch circuit comprises an n-channel metal-oxide semiconductor transistor whose drain is connected with the sources of the pair of the n-channel metal-oxide semiconductor transistors, whose source is grounded, and whose gate is connected with a node between the drain of the p-channel metal-oxide semiconductor transistor and the resistor in the supply voltage detection circuit.

8. A signal level shift circuit according to claim 6, wherein the load circuit portion comprises a pair of p-channel metal-oxide semiconductor transistors that operate based on the second supply voltage and whose gates and drains are alternately coupled together, while the drive circuit portion comprises a pair of n-channel metal-oxide semiconductor transistors whose drains are respectively connected with the drains of the pair of the p-channel metal-oxide semiconductor transistors, and wherein the switch circuit comprises a pair of n-channel metal-oxide semiconductor transistors whose drains are respectively connected with the sources of the pair of the n-channel metal-oxide semiconductor transistors, whose sources are grounded, and whose gates are commonly connected with a node between the drain of the p-channel metal-oxide semiconductor transistor and the resistor in the supply voltage detection circuit.

9. A signal level shift circuit according to claim 6, wherein the flip-flop comprises a pair of inverters alternately coupled together.

* * * * *